United States Patent
Ikeda et al.

(10) Patent No.: US 7,252,782 B2
(45) Date of Patent: Aug. 7, 2007

(54) CHEMICAL MECHANICAL POLISHING AQUEOUS DISPERSION AND CHEMICAL MECHANICAL POLISHING METHOD

(75) Inventors: Norihiko Ikeda, Chuo-ku (JP); Kazuo Nishimoto, Chuo-ku (JP); Masayuki Hattori, Chuo-ku (JP); Nobuo Kawahashi, Chuo-ku (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 11/038,190

(22) Filed: Jan. 21, 2005

(65) Prior Publication Data
US 2005/0164510 A1    Jul. 28, 2005

(30) Foreign Application Priority Data
Jan. 23, 2004  (JP) .............................. 2004-016270

(51) Int. Cl.
*C09K 13/06*    (2006.01)

(52) U.S. Cl. ................. 252/79.1; 252/79.4; 216/89; 216/90; 216/103; 438/692; 438/693; 438/700; 451/36

(58) Field of Classification Search ................. 252/79.1
See application file for complete search history.

(56) References Cited

U.S. PATENT DOCUMENTS

| | | | |
|---|---|---|---|
| 4,220,706 A | 9/1980 | Spak et al. | |
| 4,462,861 A | 7/1984 | McClean | |
| 5,100,505 A | 3/1992 | Cathey, Jr. | |
| 5,698,503 A | 12/1997 | Ward et al. | |
| 5,851,303 A | 12/1998 | Hwang et al. | |
| 6,127,908 A | 10/2000 | Bozler et al. | |
| 6,258,140 B1 | 7/2001 | Shemo et al. | |
| 6,312,486 B1* | 11/2001 | Sandhu et al. | 51/307 |
| 6,387,822 B1 | 5/2002 | Murphy et al. | |
| 6,443,811 B1 | 9/2002 | Nojo et al. | |
| 2001/0013506 A1* | 8/2001 | Chamberlin et al. | 216/88 |
| 2002/0132560 A1* | 9/2002 | Luo et al. | 451/36 |
| 2002/0193451 A1* | 12/2002 | Motonari et al. | 516/9 |

FOREIGN PATENT DOCUMENTS

EP        1 205 965 A1     5/2002

(Continued)

OTHER PUBLICATIONS

Chemical Information Sheet by the National Institute of Health, National Library of Medicine, Specialized Information Services (NLM); Internet Publishing May 2004; ☐ ☐ http://householdproducts.nlm.nih.gov/cgi-bin/household/brands?tbl=chem&id=1540☐ ☐.*

*Primary Examiner*—Duy-Vu N. Deo
*Assistant Examiner*—Patricia A. George
(74) *Attorney, Agent, or Firm*—Oblon, Spivak, McClelland, Maier & Neustadt, P.C.

(57) ABSTRACT

A chemical mechanical polishing aqueous dispersion comprises abrasives (A) containing ceria, an anionic water-soluble polymer (B) and a cationic surfactant (C), wherein the amount of the anionic water-soluble polymer (B) is in the range of 60 to 600 parts by mass based on 100 parts by mass of the abrasives (A) containing ceria, and the amount of the cationic surfactant (C) is in the range of 0.1 to 100 ppm based on the whole amount of the chemical mechanical polishing aqueous dispersion.

18 Claims, 2 Drawing Sheets

FOREIGN PATENT DOCUMENTS

| | | |
|---|---|---|
| EP | 1 357 161 A2 | 10/2003 |
| JP | 5-326469 | 12/1993 |
| JP | 9-270402 | 10/1997 |
| JP | 2000-109809 | 4/2000 |
| JP | 2001-7061 | 1/2001 |
| JP | 2001-185514 | 7/2001 |
| JP | 2002-190458 | 7/2002 |
| WO | WO 01/99170 A2 | 12/2001 |

* cited by examiner

CHEMICAL MECHANICAL POLISHING AQUEOUS DISPERSION AND CHEMICAL MECHANICAL POLISHING METHOD

FIELD OF THE INVENTION

The present invention relates to a chemical mechanical polishing aqueous dispersion and a chemical mechanical polishing method. More particularly, the invention relates to a chemical mechanical polishing aqueous dispersion favorably used for removal of an excess insulating film in a shallow trench isolation (trench isolation) step, and a chemical mechanical polishing method using the polishing aqueous dispersion and capable of flattening an interlayer insulating film in the shallow trench isolation step.

BACKGROUND OF THE INVENTION

With enhancement of degree of integration and formation of more multi-layer interconnections in the semiconductor devices, storage capacities of memory devices have been greatly increased. Although this is supported by an advancement in the fine process technology, increase of chip sizes and increase of production steps due to the fine process technology are brought about in spite of the formation of more multi-layer interconnections, whereby rising cost of chips is created. Under such circumstances, a chemical mechanical polishing technique has been introduced into polishing of process films or the like and paid attention. By the adoption of such a chemical mechanical polishing technique, a great number of the fine process technologies, such as flattening, have been embodied.

As one of such fine process technologies, shallow trench isolation, namely, so-called STI technology is known. In this STI technology, chemical mechanical polishing is carried out in order to remove an excess of an insulating layer formed on a wafer substrate. In the chemical mechanical polishing step, flatness of the polished surface is important, and on this account, various polishing agents have been studied.

For example, Japanese Patent Laid-Open Publication No. 326469/1993 and Japanese Patent Laid-Open Publication No. 270402/1997 disclose that application of an aqueous dispersion using ceria as abrasives in the chemical mechanical polishing step of STI makes it possible to enhance a removal rate and to obtain a polished surface having relatively less polishing scratches.

With developments of finer and more multi-layer interconnections of semiconductor devices, further improvement of yield or throughput of the semiconductor devices has been required in recent years. With such requirement, it has been desired to polish at a high removal rate and to provide polished surfaces substantially suffering no polishing scratches after the chemical mechanical polishing.

With respect to decrease of polishing scratches on the polished surfaces, it has been reported that polishing agents which are prepared using dispersing agents, such as polycarboxylic acid based high-molecular-weight compounds containing ammonium acrylate, in combination with surfactants (additives), such as chitosan acetate (Japanese Patent Laid-Open Publication No. 109809/2000), dodecylamine (Japanese Patent Laid-Open Publication No. 7061/2001) and polyvinyl pyrrolidone (Japanese Patent Laid-Open Publication No. 185514/2001), are effective. In such polishing agents, however, from the viewpoint of dispersibility and prevention of the sedimentation of cerium oxide particles in the slurry and decrease of polishing scratches, the amount of the dispersing agents is preferably not less than 0.01 parts by weight and not more than 2.0 parts by weight, and the amount of the surfactants is preferably not less than 0.01 parts by weight and not more than 1000 parts by weight, based on 100 parts by weight of cerium oxide particles.

U.S. Pat. No. 6,443,811 discloses a polishing agent comprising less than 5 wt % abrasive cerium oxide particles and up to about the critical micelle concentration of a cationic surfactant. The Patent also discloses that this polishing agent may contain 2 to 6 wt % anionic surfactant. However, the Patent discloses no specific examples of the anionic surfactant, and exemplifies only an ammonium or pyridinium compound having alkyl of 6 to 18 carbon atoms as the cationic surfactant.

Japanese Patent Laid-Open Publication No. 190458/2002 discloses a polishing agent comprising ceria and nitrogen atom-containing surfactant. The document also discloses that this polishing agent may further comprises a dispersing agent, such as a high-molecular-weight polyacrylic acid. In the document, however, there is no specific disclosure on the combination of the nitrogen atom-containing surfactant with the dispersing agent.

By the use of such technique, however, the removal rate is lowered though there is observed an effect of decreasing the polishing scratches, and hence improvement of throughput has not been accomplished yet.

OBJECT OF THE INVENTION

The present invention has been made in view of such circumstances of STI technology as mentioned above, and it is an object of the present invention to provide a chemical mechanical polishing aqueous dispersion capable of decreasing polishing scratches without lowering a polishing rate, and to provide a chemical mechanical polishing method using the polishing aqueous dispersion and capable removing an excess insulating film in a shallow trench isolation step.

SUMMARY OF THE INVENTION

The present inventors have found that the object described above is achieved by using the specific amount of an anionic water-soluble polymer in combination with the specific amount of a cationic surfactant in a chemical mechanical polishing aqueous dispersion comprising abrasives containing ceria. Based on the finding, the present invention has been accomplished.

A chemical mechanical polishing aqueous dispersion according to the present invention comprises abrasives (A) containing ceria, an anionic water-soluble polymer (B) and a cationic surfactant (C), wherein:

the amount of the anionic water-soluble polymer (B) is in the range of 60 to 600 parts by mass based on 100 parts by mass of the abrasives (A) containing ceria, and the amount of the cationic surfactant (C) is in the range of 0.1 to 100 ppm based on the whole amount of the chemical mechanical polishing aqueous dispersion.

A chemical mechanical polishing method according to the present invention comprises removing an excess insulating film in a shallow trench isolation step using the above-mentioned chemical mechanical polishing aqueous dispersion.

EFFECT OF THE INVENTION

According to the present invention, polishing scratches can be decreased without lowering a removal rate in the step for removing an excess insulating film in the shallow trench isolation step.

1: polishing pad
2: turn table
3: pressing head
4: object to be polished
41: silicon substrate
42: insulating film (e.g., PETEOS film)
43: stopper layer (e.g., silicon nitride layer)
44: insulating film (e.g., $SiO_2$ film)
45: idealized polished surface
5: slurry feeder

PREFERRED EMBODIMENTS OF THE INVENTION

Components of the chemical mechanical polishing aqueous dispersion of the invention are described in detail hereinafter.

The abrasives (A) added to the chemical mechanical polishing aqueous dispersion of the invention contain ceria as a constituent. As the ceria, abrasives obtained by calcining cerium hydroxide, cerium carbonate, cerium oxalate or the like can be employed. The content of the ceria in the abrasives (A) is in the range of preferably 20 to 100% by mass, more preferably 50 to 100% by mass, still more preferably 80 to 100% by mass, based on the whole amount of the abrasives.

The abrasives (A) may be only ceria or a mixture of ceria and another component, such as silica, alumina, titanium oxide, chromium oxide, manganese dioxide, dimanganese trioxide, iron oxide, zirconium oxide, silicon carbide, boron carbide, diamond and barium carbonate. Aa the abrasives (A), also employable are abrasives wherein surfaces of ceria grains are partially or wholly coated with the other component.

In combination with the abrasives comprising the ceria (including the mixture), organic particles, organic-inorganic composite particles or the like publicly known can be employed.

Examples of organic materials to form the organic particles include thermoplastic resins, specifically, polyvinyl chloride, polystyrene, styrene copolymers, polyacetal, saturated polyester, polyamide, polycarbonate, polyolefins such as polyethylene, polypropylene, poly-1-butene and poly-4-methyl-1-pentene, olefin copolymers, phenoxy resins, and (meth)acrylic resins such as polymethyl methacrylate; copolymer resins having crosslinked structure, which are obtained by copolymerizing styrene, methyl methacrylate or the like with divinylbenzene, ethylene glycol dimethacrylate or the like; and thermosetting resins, such as phenolic resin, urea resin, melamine resin, epoxy resin, alkyd resin and unsaturated polyester resin.

The organic particles comprising the material can be used singly or in combination of two or more kinds. The organic particles comprising the material can be prepared by various methods, such as emulsion polymerization, suspension polymerization, emulsion dispersing and pulverization.

The organic-inorganic composite particles are, for example, particles obtained by polycondensing alkoxysilane in the mixed state of inorganic particles and organic particles to bond polysiloxane or the like onto at least surfaces of the organic particles or particles wherein inorganic particles comprising silica, ceria or the like are bonded to organic particles by electrostatic force. The polysiloxane or the like may be directly bonded to an anionic group of the organic particle or may be indirectly bonded through a silane coupling agent or the like.

The average particle diameter of the abrasives (A) is in the range of preferably 0.01 to 3 μm, more preferably 0.02 to 1 μm, still more preferably 0.04 to 0.7 μm. If the average particle diameter is too small, the removal rate tends to become insufficient. On the other hand, if the average particle diameter is too large, the abrasives may settle out or separate off, and therefore, a stable polishing aqueous dispersion cannot be obtained occasionally. The average particle diameter can be measured by the use of an apparatus for dynamic light scattering or laser scattering diffraction or a transmission electron microscope. It is also possible that the average particle diameter may be calculated from a data of a specific surface area of the dried abrasive.

The amount of the abrasives (A) contained in the chemical mechanical polishing aqueous dispersion of the invention is preferably not more than 5% by mass, more preferably 0.05 to 5% by mass, still more preferably 0.05 to 3% by mass, particularly preferably 0.1 to 2% by mass, based on the total 100% by mass of the polishing aqueous dispersion. The content of the ceria is in the range of preferably 0.02 to 5% by mass, more preferably 0.05 to 3% by mass, still more preferably 0.1 to 2% by mass, based on the total 100% by mass of the polishing aqueous dispersion. If the content of the ceria is too small, efficient polishing cannot be achieved occasionally. On the other hand, if the content thereof is too large, the polishing aqueous dispersion is liable to become dry, and because the coarse dry powder is formed, scratches are sometimes increased.

The chemical mechanical polishing aqueous dispersion of the invention further contains an anionic water-soluble polymer (B). Examples of the anionic water-soluble polymers (B) include (1) polycarboxylic acid, polystyrenesulfonic acid, polyisoprenesulfonic acid and polyglutamic acid, (2) copolymers of a monomer having an anionic group and another monomer, (3) salts of the above-mentioned acid (1), (4) mixtures of the above-mentioned acid (1) and salt (3), (5) salt compounds obtained by neutralizing the anionic group of the above-mentioned copolymer (2), and (6) mixtures of the above-mentioned copolymer (2) and salt compound (5).

The polycarboxylic acid is, for example, poly(meth) acrylic acid.

Examples of the monomers having an anionic group include (meth)acrylic acid, styrenesulfonic acid, naphthalenesulfonic acid and isoprenesulfonic acid. Examples of the other monomers include (meth)acrylamide, (meth)acrylic acid ester, styrene, butadiene and isoprene. Examples of the (meth)acrylic acid esters include methyl (meth)acrylate, ethyl (meth)acrylate and benzyl (meth)acrylate.

When the salt compound (5) or the mixture (6) of the copolymer (2) and the salt compound (5) is used as the anionic water-soluble polymer (B), the counter cation for them is, for example, an ammonium ion, an alkylammonium ion or a potassium ion.

When the salt compound (5) or the mixture (6) of the copolymer (2) and the salt compound (5) is used as the anionic water-soluble polymer (B), after the monomer having an anionic group is copolymerized with the other monomer, all or a part of anionic groups of the resulting copolymer may be neutralized to form the salt compound (5) or the mixture (6) thereof, or the monomer having an anionic group and/or the salt thereof may be copolymerized with the other monomer to form the salt compound (5) or the mixture (6) thereof.

The anionic water-soluble polymer (B) has a weight-average molecular weight, as measured by gel permeation chromatography (GPC) using water as a solvent, of preferably 3,000 to 30,000, more preferably 4,000 to 20,000, still more preferably 5,000 to 15,000, in terms of polyethylene glycol. By the use of the anionic water-soluble polymer (B) having a weight-average molecular weight of this range, a chemical mechanical polishing aqueous dispersion having a good balance between a removal rate and flattening performance can be obtained.

The amount of the anionic water-soluble polymer (B) contained in the chemical mechanical polishing aqueous dispersion of the invention is in the range of 60 to 600 parts by mass, preferably 60 to 500 parts by mass, more preferably 60 to 450 parts by mass, based on 100 parts by mass of the abrasives (A) containing ceria. By the use of the anionic water-soluble polymer (B) in this amount, a chemical mechanical polishing aqueous dispersion having a good balance between dispersibility of the abrasives (A) containing ceria and a removal rate can be obtained.

The chemical mechanical polishing aqueous dispersion of the invention further contains a cationic surfactant (C). As the cationic surfactant (C), a cationic surfactant having a nitrogen atom is employable, and a cationic surfactant having a nitrogen atom and no oxygen atom is preferable. Examples of such cationic surfactants include alkyltrimethylammonium chlorides containing an alkyl group of 12 to 18 carbon atoms such as lauryltrimethylammonium chloride, cetyltrimethylammonium chloride, stearyltrimethylammmonium chloride; dialkyldimethylammonium chlorides containing an alkyl group of 12 to 18 carbon atoms such as distearyldimethylammonium chloride; alkylimidazoline, benzalkonium chloride, polyethyleneimine, laurylamine acetate, stearylamine acetate and a compound having a structure represented by the following formula (1).

(1)

Of these cationic surfactants (C), lauryltrimethylammonium chloride, polyethyleneimine and the compound having a structure represented by the formula (1) is preferable.

The cationic surfactant (C) has a molecular weight of preferably not less than 500, more preferably 500 to 1.00 million, still more preferably 1000 to 500 thousand, particularly preferably 1000 to 250 thousand. When the cationic surfactant (C) is a monomer, the molecular weight is theoretical value calculated on the basis of its chemical formula. When the cationic surfactant (C) is a polymer, the molecular weight is a weight-average molecular weight as measured by GPC. The weight-average molecular weight is a value measured using a suitable solvent and equivalent in a suitable standard substance. For example, in the case of polyethyleneimine, 0.2 mol/litter of monoethanolamine aqueous solution (adjusted to pH=5.1 with acetic acid) is used as a solvent and saccharides such as maltotriose, maltoheptaose and pullulan are used as a suitable standard substance. In the case of the compound having a structure represented by the formula (1), an aqueous solution containing 5 mol/litter of acetic acid and 0.2 mol/litter of sodium nitrate is used as a solvent and polyethylene glycol is used as a suitable standard substance.

When the compound having a structure represented by the formula (1) is used as the cationic surfactant (C), the compound is preferably a surfactant having a structure wherein the structure represented by the formula (1) is continuously repeated. Although there is no specific limitation on the molecular weight of the compound having a structure represented by the formula (1), the compound desirably has such a molecular weight that the viscosity of a 40wt % aqueous solution of the cationic surfactant (C), as measured at 25C, becomes preferably 5,000 to 50,000 mPa·s, more preferably 7,500 to 20,000 mPa·s, particularly preferably 10,000 to 15,000 mPa·s. A commercially available product of such a compound is, for example, ADEKA CATIOACE PD-50 (available from Asahi Electro-Chemical Co., Ltd.).

The amount of the cationic surfactant (C) contained in the chemical mechanical polishing aqueous dispersion of the invention is in the range of 0.1 to 100 ppm, preferably 1 to 50 ppm, more preferably 1 to 20 ppm, based on the whole amount of the polishing aqueous dispersion. When the amount of the cationic surfactant (C) is added in an amount of this range, a chemical mechanical polishing aqueous dispersion having a good balance between a removal rate and an effect of decreasing polishing scratches of the polished surface can be obtained.

To the chemical mechanical polishing aqueous dispersion of the invention, an acid (D) can be further added to stabilize the polishing aqueous dispersion and to enhance selectivity. There is no specific limitation on the acid (D), and any of organic acids and inorganic acids is employable.

Examples of the organic acids include paratoluenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid and phthalic acid.

Examples of the inorganic acids include nitric acid, hydrochloric acid and sulfuric acid.

These organic acids and inorganic acids can be used singly or in combination of two or more kinds. Further, a combination of the organic acid and the inorganic acid is also employable.

The amount of the acid (D) added is preferably not more than 2% by mass, more preferably not more than 1% by mass, based on total 100% by mass of the chemical mechanical polishing aqueous dispersion.

In the present invention, to the chemical mechanical polishing aqueous dispersion, a base (E) can be further contained to adjust pH depending on the constituent of the abrasives used, and thereby dispersibility of the abrasives, a removal rate and selectivity can be improved. There is no specific limitation on the base (E), and any of organic bases and inorganic bases is employable.

Examples of the organic bases include nitrogen-containing organic compounds, such as ethylenediamine and ethanolamine.

Examples of the inorganic bases include ammonia, potassium hydroxide, sodium hydroxide and lithium hydroxide.

These organic bases and inorganic bases can be used singly or in combination of two or more kinds. Further, a combination of the organic base and the inorganic base is also employable.

The amount of the base (E) added is preferably not more than 1% by mass, more preferably not more than 0.5% by mass, based on total 100% by mass of the chemical mechanical polishing aqueous dispersion.

Examples of dispersion media for the chemical mechanical polishing aqueous dispersion of the invention include water, a mixed medium of water and an alcohol (e.g., methanol), and a mixed medium of water and another component. Of these, water is preferably employed.

The chemical mechanical polishing aqueous dispersion has pH of preferably 5 to 12. When pH of the chemical mechanical polishing aqueous dispersion is in this range, the chemical mechanical polishing aqueous dispersion having a high removal rate and capable of providing a polished surface with decreased polishing scratches can be obtained. Further, stability of the polishing aqueous dispersion itself is also excellent.

Although the polishing aqueous dispersion of the invention contains the above components in the above amounts, it can be stored or transported in the form of a concentrated aqueous dispersion. Prior to use in the chemical mechanical polishing step, the concentrated aqueous dispersion is diluted to adjust the amount of each component in the above-mentioned recommended range.

When the polishing aqueous dispersion of the invention is concentrated, it is preferable that the amount of the abrasives (A) containing ceria should not exceed 20% by mass based on the whole amount of the polishing aqueous dispersion. By concentrating to such a concentration, the polishing aqueous dispersion can be stably stored for a long period of time.

The chemical mechanical polishing aqueous dispersion of the invention can be favorably used for removing an excess insulating film in a shallow trench isolation (STI) step of the process for manufacturing a semiconductor device. For example, the chemical mechanical polishing aqueous dispersion can be used for polishing a semiconductor substrate with an irregular surface wherein an embedded insulating film is formed on a substrate having a trench for device isolation and made of silicon or the like, and a polishing target material, such as an insulating film exemplified below.

Examples of the insulating film made of an insulating material include silicon oxide film ($SiO_2$ film), a boron phosphorus silicate film (BPSG film) wherein small amounts of boron and phosphorus are added to $SiO_2$, an insulating film called FSG (fluorine doped silicate glass) wherein $SiO_2$ is doped with fluorine, and a silicon oxide based insulating film of a low dielectric constant.

The silicon oxide is, for example, a thermally-oxidized film, a PETEOS film (plasma enhanced-TEOS film), a HDP film (high density plasma enhanced-TEOS film) or a silicon oxide film obtained by a thermal CVD method.

The boron phosphorus silicate film (BPSG film) can be prepared by an atmospheric pressure CVD method (AP-CVD method) or a low-pressure CVD method (LP-CVD method).

The insulating film called FSG can be prepared by chemical vapor deposition applying high-density plasma as the acceleration conditions.

The silicon oxide based insulating film of a low dielectric constant can be obtained by coating a substrate with a raw material by a rotary coating method or the like and then heating the substrate in an oxidizing atmosphere. Examples of such insulating films include a HSQ film (hydrogen silsesquioxane film) using triethoxysilane as a raw material and a MSQ film (methyl silsesquioxane film) containing methyltrimethoxysilane as a part of raw materials in addition to tetraethoxysilane.

The thermally-oxidized film can be prepared by exposing silicon of high temperature to an oxidizing atmosphere to subject silicon and oxygen or silicon and water to chemical reaction.

The PETEOS film can be prepared by chemical vapor deposition using tetraethyl orthosilicate (TEOS) as a raw material and applying plasma as the acceleration conditions.

The HDP film can be prepared by chemical vapor deposition using tetraethyl orthosilicate (TEOS) as a raw material and applying high-density plasma as the acceleration conditions.

The silicon oxide film obtained by a thermal CVD method can be prepared by an atmospheric pressure CVD method (AP-CVD method) or a low-pressure CVD method (LP-CVD method).

Figure 2:
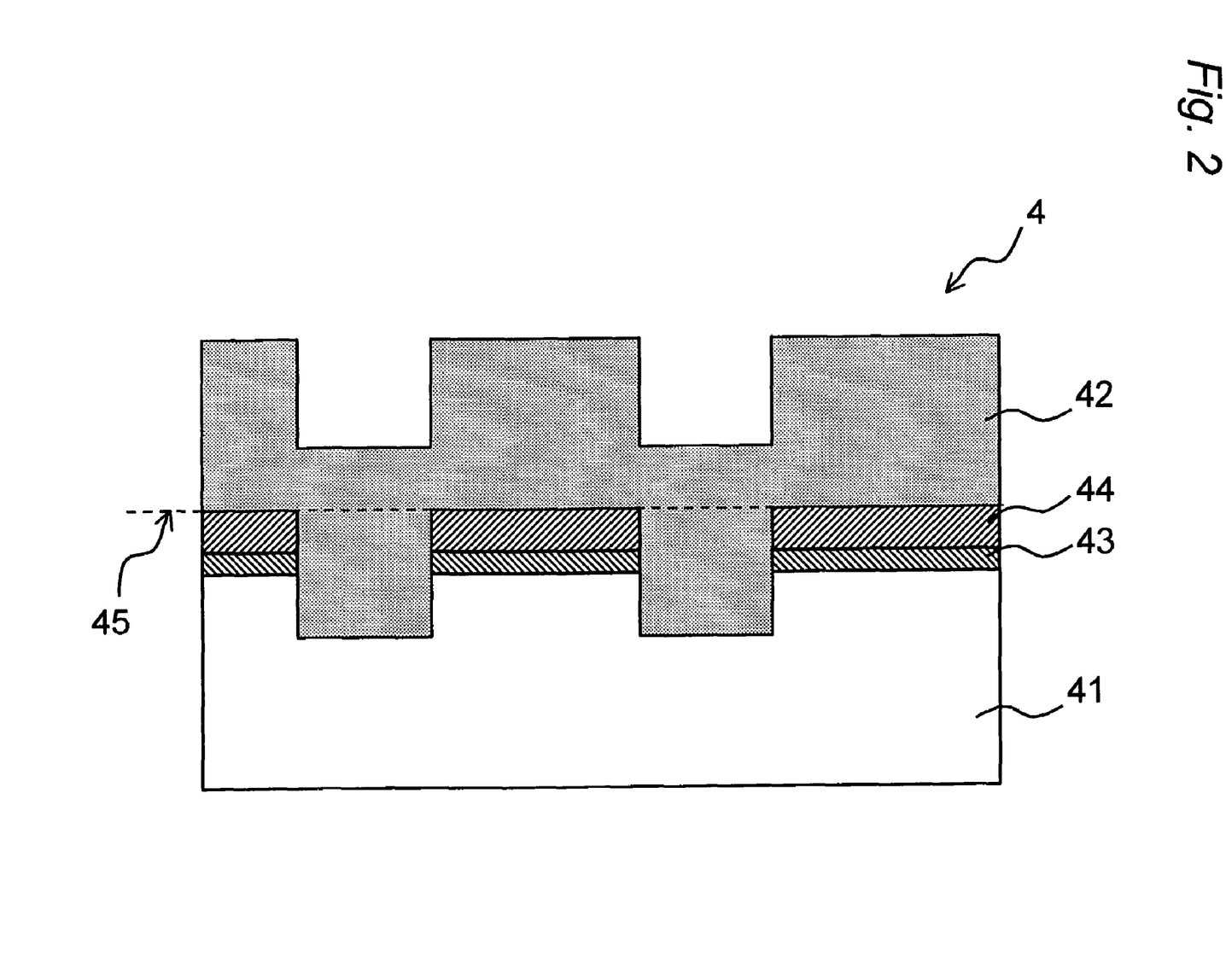
FIG. 2 is a schematic view showing an example of an object to be polished (e.g., wafer).

The object to be polished having such an insulating film is, for example, a wafer having such a configuration as shown in FIG. 2.

The polishing by the chemical mechanical polishing method is carried out under publicly known polishing conditions using polishing apparatuses, such as Model "EPO-112" and Model "EPO-222" (both manufactured by Ebara Corporation), Model "LGP-510" and Model "LGP-552" (both manufactured by Lap Master SFT Co.), "Mirra" (trade name, manufactured by Applied Materials Co.), "Teres" (trade name, manufactured by Lam Research Co.), and Model "AVANTI 472" (manufactured by Speed Fam-IPEC Inc.).

Figure 1:
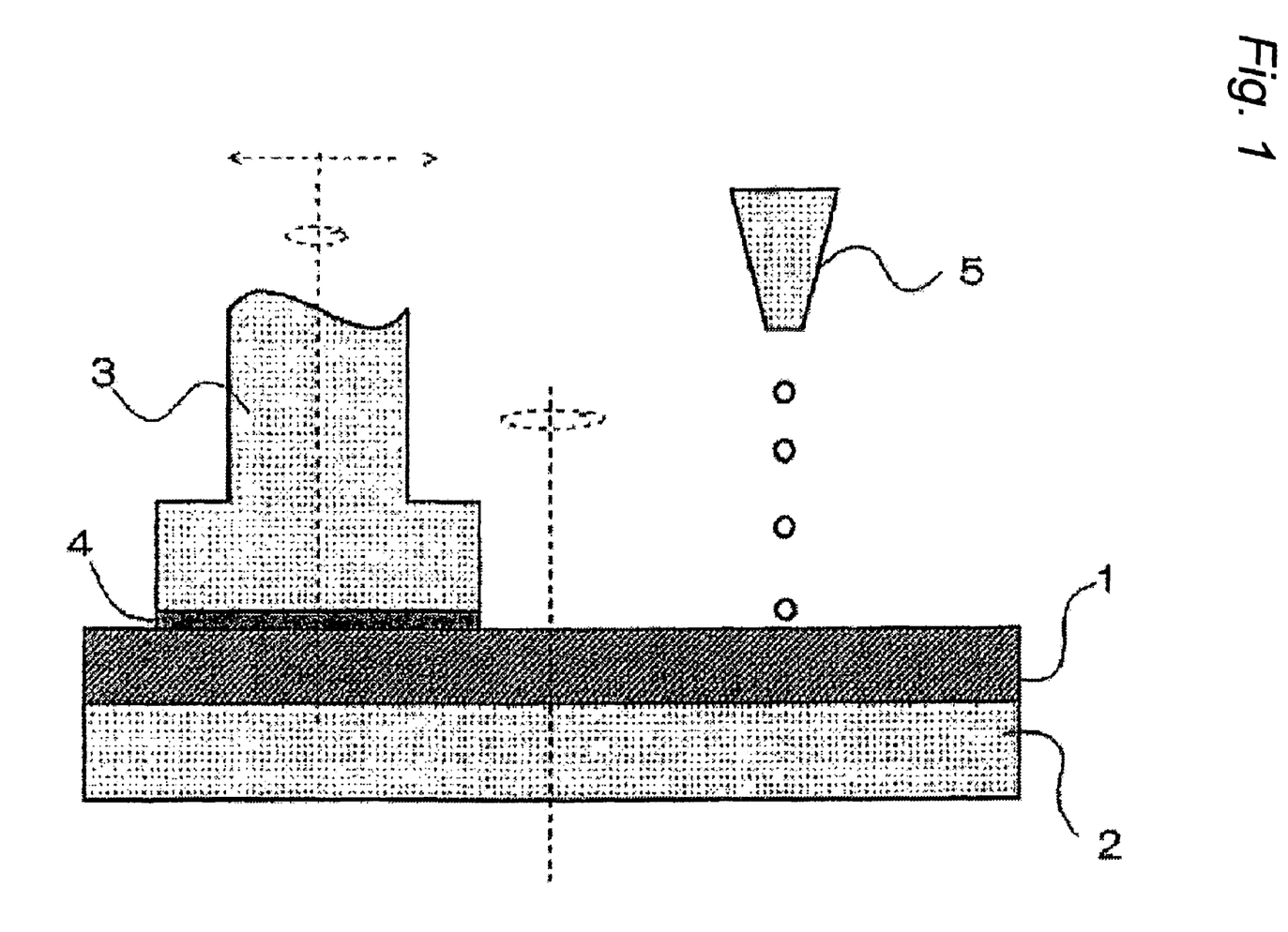
FIG. 1 is a schematic view showing an exemplary embodiment of a chemical mechanical polishing method according to the present invention.

The chemical mechanical polishing method of the invention is described in detail with reference to FIG. 1, but it should be construed that the invention is in no way limited to the method exemplified. First, onto a turn table 2 that undergoes axial rotation, a polishing pad 1 is fixed, and an object 4 to be polished is mounted onto one end of a pressing head 3. The pressing head 3 rotates and moves by itself with pressing the object 4 to be polished against a surface of the polishing pad 1, whereby the object 4 to be polished can be slid on the surface of the polishing pad 1. The chemical mechanical polishing method of the invention is a polishing method to remove an excess insulating film by the above-mentioned sliding while the chemical mechanical polishing aqueous dispersion of the invention is dropped onto the surface of the polishing pad 1 from above (slurry feeder 5 or the like).

As preferable polishing conditions, the rotating speed of a turn table is in the range of usually 50 to 150 rpm, preferably 80 to 120 rpm. The rotating speed of a pressing head is in the range of usually 50 to 150 rpm, preferably 80 to 120 rpm. A ratio of the turn table rotating speed to the head rotating speed is in the range of usually 0.5 to 2, preferably 0.7 to 1.5. The polishing pressure is in the range of usually 200 to 800 $g/cm^2$, preferably 400 to 600 $g/cm^2$. The feed rate of the polishing aqueous dispersion is in the range of usually 50 to 300 ml/min, preferably 100 to 200 ml/min.

As the polishing pad, a publicly known polishing pad can be employed. Examples of the polishing pads employable herein include "IC1000/SUBA400" and "IC1010, SUBA series, Polytex series" (trade names, available from Rodel Nitta Company). In the process of the polishing, the polishing pad may be changed to a different polishing pad.

According to the chemical mechanical polishing method of the invention, an insulating film can be removed at a removal rate of preferably not less than 10 nm/min, more preferably not less than 20 nm/min.

EXAMPLES

The present invention is further described with reference to the following examples.

Example 1

<Preparation of Chemical Mechanical Polishing Aqueous Dispersion>

In nitric acid, bastnaesite was dissolved, and then recrystallization was repeated three times to give highly purified cerium carbonate. The cerium carbonate was heated at 900° C. for 5 hours in air to give ceria. The ceria was pulverized by a bead mill using zirconia beads and then classified through a hydraulic elutriation step.

The ceria particles thus obtained were dispersed in an ion-exchanged water in the presence of nitric acid so that the content of the ceria particles became 5.0% by mass, and then pH of the dispersion was adjusted to 6. Thus, a water dispersion (hereinafter referred to as "water dispersion of ceria") containing ceria having an average particle diameter (secondary particle diameter) of 0.24 μm was obtained.

Subsequently, the water dispersion of ceria was diluted to 0.5% by mass by addition of an ion-exchanged water, and an aqueous solution (concentration: 30% by mass) of ammonium polyacrylate having a weight-average molecular weight of 7,000 was added as an anionic water-soluble polymer (B) in such an amount that the content of ammonium polyacrylate became 1.6% by mass based on the whole amount of the chemical mechanical polishing aqueous dispersion, followed by stirring for 5 minutes. Then, an aqueous solution (trade name: ADEKA CATIOACE PD-SO, available from Asahi Electro-Chemical Co., Ltd.) containing poly-dimethylmethylenepiperidinium chloride (weight-average molecular weight: 120,000), which corresponds to a compound having a structure wherein the structure of the following formula (1) is continuously repeated, was added as a cationic surfactant (C) in such an amount that the content of poly-dimethylmethylenepiperidinium chloride became 10 ppm based on the whole amount of the chemical mechanical polishing aqueous dispersion, followed by stirring for 5 minutes to prepare a chemical mechanical polishing aqueous dispersion having pH of 6.3. The weight-average molecular weight of poly-dimethylmethylenepiperidinium chloride was measured by GPC using an aqueous solution containing 5 mol/litter of acetic acid and 0.2 mol/litter of sodium nitrate as a solvent and polyethylene glycol as a standard substance.

(1)

<Chemical Mechanical Polishing of Insulating Film>

Using the chemical mechanical polishing aqueous dispersion, chemical mechanical polishing of a PETEOS film (having no difference in level) having a diameter of 8 inches as a polishing target material was carried out under the following conditions.

(Polishing Conditions)
Polishing apparatus: Model "EPO-112", manufactured by Ebara Corporation
Polishing pad: IC1000/SUBA400, available from Rodel Nitta Company
Turn table rotating speed: 100 rpm
Pressing head rotating speed: 107 rpm
Pressing head pressure: 490 g/cm$^2$
Feed rate of polishing aqueous dispersion: 200 ml/min
Polishing time: 5 minutes <Evaluation of Removal Rate>

The film thickness of the polishing target material was measured before and after the polishing operation by the use of an optical interferotype film thickness meter "NanoSpec 6100" (manufactured by Nanometrics Japan Ltd.), and a difference between the resulting values was divided by a polishing time to obtain a polishing rate. The removal rate is set forth in Table 1.

It can be judged that when this value exceeds 20 nm/min, the removal rate is vary good, when the value is in the range of 10 to 20 nm/min, the removal rate is good, and when the value is less than 10 nm/min, the removal rate is usually bad.

<Evaluation of Number of Scratches>

After the polishing operation, defect inspection of the PETEOS film was carried out by means of "KLA2351" (manufactured by KLA Tencor Co.). First, "defects" on the whole surface of the wafer were counted by "KLA2351" under the conditions of a pixel size of 0.39 μm and a threshold value of 50. From these "defects", 250 defects were sampled at random, and they were observed to check whether each defect was a scratch or a dust having adhered. Then, a ratio of scratches to the "defects" was determined, and from the ratio, the number of scratches per the whole surface of the wafer was calculated. The result is set forth in Table 1.

It can be judged that when this value is not more than 500 scratches/surface, the number of scratches is very good, when the value is in the range of 501 to 2,000 scratches/surface, the number of scratches is good, and when the value is not less than 2,001 scratches/surface, the number of scratches is usually bad.

Example 2

A chemical mechanical polishing aqueous dispersion having pH of 6.3 was prepared in the same manner as in Example 1, except that the content of ADEKA CATIOACE PD-50 was changed to 100 ppm in terms of poly-dimethylmethylenepiperidinium chloride, based on the whole amount of the chemical mechanical polishing aqueous dispersion. Then, the polishing properties were evaluated in the same manner as in Example 1. The results are set forth in Table 1.

Comparative Example 1

A chemical mechanical polishing aqueous dispersion having pH of 6.4 was prepared without the cationic surfactant (C) in the same manner as in Example 1. Then, the polishing properties were evaluated in the same manner as in Example 1. The results are set forth in Table 1.

Comparative Examples 2 to 4

Chemical mechanical polishing aqueous dispersions having pH of 6.3 were prepared in the same manner as in Example 1, except that the contents of ADEKA CATIOACE PD-50 were changed to the equivalent amounts in poly-dimethylmethylenepiperidinium chloride set forth in Table 1, respectively. Then, the polishing properties were evaluated in the same manner as in Example 1. The results are set forth in Table 1.

Example 3

A chemical mechanical polishing aqueous dispersion having pH of 6.3 was prepared in the same manner as in Example 1, except that instead of poly-dimethylmethylenepiperidinium chloride, lauryltrimethylammonium chloride (theoretical molecular weight: 263.5) was added as the cationic surfactant (C) in an amount of 10 ppm based on the whole amount of the chemical mechanical polishing aqueous dispersion. Then, the polishing properties were evaluated in the same manner as in Example 1. The results are set forth in Table 1.

Comparative Example 5

A chemical mechanical polishing aqueous dispersion having pH of 6.3 was prepared in the same manner as in Example 3, except that lauryltrimethylammonium chloride was added as a cationic surfactant (C) in an amount of 10000 ppm based on the whole amount of the chemical mechanical polishing aqueous dispersion. Then, the polishing properties were evaluated in the same manner as in Example 3. The results are set forth in Table 1.

Examples 4 to 8

Chemical mechanical polishing aqueous dispersions having pH of 6.3 were prepared in the same manner as in Example 1, except that instead of poly-dimethylmethylenepiperidinium chloride, polyethyleneimines having a weight-average molecular weight set forth in Table 1 were used as a cationic surfactant (C) in an amounts set forth in Table 1, respectively. Then, the polishing properties were evaluated in the same manner as in Example 1. The results are set forth in Table 1. The weight-average molecular weight of polyethyleneimine was measured by GPC using as a solvent 0.2 mol/litter of monoethanolamine aqueous solution adjusted to pH 5.1 with acetic acid and the following saccharides as a standard substance.

maltotriose: molecular weight of 504
maltoheptaose: molecular weight of 1153
pullulans: molecular weights of 5800, 12200, 23700, 48000, 100000, 186000, 380000, 853000

Comparative Example 6

A chemical mechanical polishing aqueous dispersion having pH of 6.3 was prepared in the same manner as in Example 6, except that polyethyleneimine was added as a cationic surfactant (C) in an amount of 0.05 ppm based on the whole amount of the chemical mechanical polishing aqueous dispersion. Then, the polishing properties were evaluated in the same manner as in Example 6. The results are set forth in Table 1.

Comparative Example 7

A chemical mechanical polishing aqueous dispersion having pH of 6.3 was prepared in the same manner as in Example 4, except that polyethyleneimine was added as a cationic surfactant (C) in an amount of 1000 ppm based on the whole amount of the chemical mechanical polishing aqueous dispersion. Then, the polishing properties were evaluated in the same manner as in Example 4. The results are set forth in Table 1.

Comparative Example 8

A chemical mechanical polishing aqueous dispersion having pH of 6.3 was prepared in the same manner as in Example 7, except that polyethyleneimine was added as a cationic surfactant (C) in an amount of 500 ppm based on the whole amount of the chemical mechanical polishing aqueous dispersion. Then, the polishing properties were evaluated in the same manner as in Example 7. The results are set forth in Table 1.

TABLE 1

|  | cationic surfactant (C) | | | | removal | |
| --- | --- | --- | --- | --- | --- | --- |
|  |  | Mw | content (ppm) | pH | rate (nm/min) | number of scratches (scratches/surface) |
| Ex. 1 | poly-dimethylmethylenepiperidinium chloride | 120000 | 10 | 6.3 | 28 | 442 |
| Ex. 2 | poly-dimethylmethylenepiperidinium chloride | 120000 | 100 | 6.3 | 15 | 120 |
| Ex. 3 | lauryltrimethylammonium chloride | 263.5 | 10 | 6.3 | 27 | 921 |
| Ex. 4 | polyethyleneimine | 600 | 0.1 | 6.3 | 31 | 1047 |
| Ex. 5 | polyethyleneimine | 1200 | 50 | 6.3 | 21 | 357 |
| Ex. 6 | polyethyleneimine | 1800 | 70 | 6.3 | 17 | 207 |
| Ex. 7 | polyethyleneimine | 10000 | 1 | 6.3 | 28 | 876 |
| Ex. 8 | polyethyleneimine | 70000 | 20 | 6.3 | 23 | 368 |
| Comp. Ex. 1 | none |  |  | 6.4 | 31 | 2001 |
| Comp. Ex. 2 | poly-dimethylmethylenepiperidinium chloride | 120000 | 10000 | 6.3 | 3 | 49 |
| Comp. Ex. 3 | poly-dimethylmethylenepiperidinium chloride | 120000 | 0.05 | 6.3 | 31 | 2483 |
| Comp. Ex. 4 | poly-dimethylmethylenepiperidinium chloride | 120000 | 1000 | 6.3 | 5 | 26 |
| Comp. Ex. 5 | lauryltrimethylammonium chloride | 263.5 | 10000 | 6.3 | 7 | 87 |
| Comp. Ex. 6 | polyethyleneimine | 1800 | 0.05 | 6.3 | 30 | 2169 |

TABLE 1-continued

|  | cationic surfactant (C) | | | removal | |
| --- | --- | --- | --- | --- | --- |
|  |  | Mw | content (ppm) | pH | rate (nm/min) | number of scratches (scratches/surface) |
| Comp. Ex. 7 | polyethyleneimine | 600 | 1000 | 6.3 | 6 | 19 |
| Comp. Ex. 8 | polyethyleneimine | 10000 | 500 | 6.3 | 8 | 7 |

MW: weight-average molecular weight

It can be seen from the results of the examples and the comparative examples that when the cationic surfactant (C) was not added (Comparative Example 1), and when the content of cationic surfactant (C) is less than 0.1 ppm based on the whole amount of the chemical mechanical polishing aqueous dispersion (Comparative Examples 3 and 6), the number of scratches became bad though the removal rate was good. It can be also seen that when the content of the cationic surfactant (C) exceeded 100 ppm based on the whole amount of the chemical mechanical polishing aqueous dispersion, the removal rate became low though the number of scratches was small (Comparative Examples 2, 4, 5, 7 and 8). It was confirmed that neither of them is suitable for practical use.

On the other hand, in Examples 1 to 8, both the removal rate and the number of scratches were very good or good. That is to say, it was confirmed that these chemical mechanical polishing aqueous dispersions have very excellent properties as a polishing aqueous dispersion used in the step for removal of an excess insulating film in the shallow trench isolation step.

INDUSTRIAL APPLICABILITY

According to the present invention, an excess insulating film can be removed at a good removal rate, and substrates comprising an insulating film having less scratch can be manufactured.

What is claimed is:

1. A chemical mechanical polishing aqueous dispersion comprising abrasives (A) containing ceria, an anionic water-soluble polymer (B) and a water-soluble cationic surfactant (C), wherein:

the water-soluble cationic surfactant (C) has a nitrogen atom but no oxygen atom, the amount of the anionic water-soluble polymer (B) is in the range of 60 to 600 parts by mass based on 100 parts by mass of the abrasives (A) containing ceria, and the amount of the water-soluble cationic surfactant (C) is in the range of 0.1 to 100 ppm based on the whole amount of the chemical mechanical polishing aqueous dispersion.

2. A chemical mechanical polishing method comprising removing an excess insulating film in a shallow trench isolation step using the chemical mechanical polishing aqueous dispersion as claimed in claim 1.

3. A chemical mechanical polishing aqueous dispersion consisting essentially of abrasives (A) containing ceria, an anionic water-soluble polymer (B) and a water-soluble cationic surfactant (C), wherein:

the amount of the anionic water-soluble polymer (B) is in the range of 60 to 600 parts by mass based on 100 parts by mass of the abrasives (A) containing ceria, and the amount of the water-soluble cationic surfactant (C) is in the range of 0.1 to 100 ppm based on the whole amount of the chemical mechanical polishing aqueous dispersion.

4. A chemical mechanical polishing aqueous dispersion consisting essentially of abrasives (A) containing ceria, an anionic water-soluble polymer (B), a water-soluble cationic surfactant (C) and an acid (D), wherein the amount of the anionic water-soluble polymer (B) is in the range of 60 to 600 parts by mass based on 100 parts by mass of the abrasives (A) containing ceria, and the amount of the water-soluble cationic surfactant (C) is in the range of 0.1 to 100 ppm based on the whole amount of the chemical mechanical polishing aqueous dispersion, and the amount of the acid (D) is not more than 2% by mass based on total 100% by mass of the chemical mechanical polishing aqueous dispersion.

5. A chemical mechanical polishing aqueous dispersion consisting essentially of the abrasives (A) containing ceria, an anionic water-soluble polymer (B), the a water-soluble cationic surfactant (C) and a base (E), wherein the amount of the anionic water-soluble polymer (B) is in the range of 60 to 600 parts by mass based on 100 parts by mass of the abrasives (A) containing ceria, and the amount of the water-soluble cationic surfactant (C) is in the range of 0.1 to 100 ppm based on the whole amount of the chemical mechanical polishing acidness dispersion, and the amount of the base (E) is not more than 1% by mass based on total 100% by mass of the chemical mechanical polishing aqueous dispersion.

6. The chemical mechanical polishing aqueous dispersion according to claim 1, wherein the amount of the water-soluble cationic surfactant (C) is in the range of 0.1 to 50 ppm based on the whole amount of the chemical mechanical polishing aqueous dispersion.

7. The chemical mechanical aqueous dispersion according to claim 1, wherein the anionic water-soluble polymer (B) is ammonium polyacrylate.

8. The chemical mechanical aqueous dispersion according to claim 1, wherein the water-soluble cationic surfactant (C) is a member selected from the group consisting of polydimethylmethylenepiperdinium chloride, and lauryltrimethylanimonium chloride.

9. The chemical mechanical polishing aqueous dispersion according to claim 1, wherein the amount of the water-soluble cationic surfactant (C) is in the range of 0.1 to 70 ppm based on the whole amount of the chemical mechanical polishing aqueous dispersion.

10. The chemical mechanical polishing aqueous dispersion according to claim 3, wherein the amount of the water-soluble cationic surfactant (C) is in the range of 0.1 to 50 ppm based on the whole amount of the chemical mechanical polishing aqueous dispersion.

11. The chemical mechanical polishing aqueous dispersion according to claim 3, wherein the anionic water-soluble polymer (B) is ammonium polyacrylate.

12. The chemical mechanical polishing aqueous dispersion according to claim 3, wherein the water-soluble cationic surfactant (C) is a member selected from the group consisting of poly-dimethylmethylenepiperidinium chloride, lauryltrimethylanimonium chloride, and polyethyleneimine.

13. The chemical mechanical polishing aqueous dispersion according to claim 4, wherein the amount of the water-soluble cationic surfactant (C) is in the range of 0.1 to 50 ppm based on the whole amount of the chemical mechanical polishing aqueous dispersion.

14. The chemical mechanical polishing aqueous dispersion according to claim 4, wherein the anionic water-soluble polymer (B) is ammonium polyacrylate.

15. The chemical mechanical polishing aqueous dispersion according to claim 4, wherein the water-soluble cationic surfactant (C) is a member selected from the group consisting of poly-dimethylmethylenepiperidinium chloride, lauryltrimethylammonium chloride, and polyethyleneimine.

16. The chemical mechanical polishing aqueous dispersion according to claim 5, wherein the amount of the water-soluble cationic surfactant (C) is in the range of 0.1 to 50 ppm based on the whole amount of the chemical mechanical polishing aqueous dispersion.

17. The chemical mechanical polishing aqueous dispersion according to claim 5, wherein the anionic water-soluble polymer (B) is ammonium polyacrylate.

18. The chemical mechanical polishing aqueous dispersion according to claim 5, wherein the water-soluble cationic surfactant (C) is a member selected from the group consisting of poly-dimethylmethylenepiperidinium chloride, lauryltrimethylammonium chloride, and polyethyleneimine.

* * * * *